US009415413B2

(12) United States Patent
Whalen et al.

(10) Patent No.: US 9,415,413 B2
(45) Date of Patent: Aug. 16, 2016

(54) SYNTHETIC JET SUSPENSION STRUCTURE

(71) Applicant: General Electric Company, Schenectady, NY (US)

(72) Inventors: Bryan Patrick Whalen, Gansevoort, NY (US); Hendrik Pieter Jacobus de Bock, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 211 days.

(21) Appl. No.: 14/205,558

(22) Filed: Mar. 12, 2014

(65) Prior Publication Data

US 2014/0263725 A1    Sep. 18, 2014

Related U.S. Application Data

(60) Provisional application No. 61/783,954, filed on Mar. 14, 2013.

(51) Int. Cl.
*B05B 1/08* (2006.01)
*B05B 17/00* (2006.01)

(52) U.S. Cl.
CPC ............. *B05B 17/0638* (2013.01); *B05B 1/086* (2013.01); *Y10T 29/49826* (2015.01)

(58) Field of Classification Search
CPC ...... B05B 17/0638; B05B 1/086; B05B 3/14; Y10T 29/49826
USPC ........... 239/102.1, 102.2, 546, 556, 557, 562, 239/563, 564, 566; 361/694, 689, 690, 692, 361/695, 697, 271, 277, 278; 174/16.1; 165/104.28, 104.33
See application file for complete search history.

(56) References Cited

U.S. PATENT DOCUMENTS 6,722,581 B2    4/2004  Saddoughi
7,204,615 B2    4/2007  Arik et al.
(Continued)

FOREIGN PATENT DOCUMENTS

JP    2008-008230 A    1/2008
JP      5123041 B2    1/2013
WO    2013166394 A1   11/2013

OTHER PUBLICATIONS

International Search Report and Written Opinion issued in connection with corresponding PCT Application No. PCT/US2014/024011 dated Aug. 5, 2014.

(Continued)

*Primary Examiner* — Justin Jonaitis
(74) *Attorney, Agent, or Firm* — Ziolkowski Patent Solutions Group, SC; Jean K. Testa

(57) ABSTRACT

A system and method for providing vibration dampening between a synthetic jet and stationary mounting bracket is disclosed. A synthetic jet assembly includes a synthetic jet having a first plate, a second plate spaced apart from the first plate, a spacer element positioned between the first and second plates to maintain the first and second plates in a spaced apart relationship, the spacer element including an orifice formed therein, and an actuator element coupled to at least one of the first and second plates to selectively cause deflection thereof such that a fluid flow is generated and projected out from the orifice. The synthetic jet assembly also includes a mounting bracket positioned about the synthetic jet to support the synthetic jet and a plurality of suspension tabs coupling the synthetic jet to the mounting bracket in a suspended arrangement.

17 Claims, 5 Drawing Sheets

(56) References Cited

U.S. PATENT DOCUMENTS

| | | | |
|---|---|---|---|
| 7,387,491 | B2 | 6/2008 | Saddoughi et al. |
| 7,543,961 | B2 | 6/2009 | Arik et al. |
| 7,556,406 | B2 | 7/2009 | Petroski et al. |
| 7,688,583 | B1 | 3/2010 | Arik et al. |
| 7,990,705 | B2 | 8/2011 | Bult et al. |
| 8,006,917 | B2 | 8/2011 | Arik et al. |
| 8,051,905 | B2 | 11/2011 | Arik et al. |
| 8,083,157 | B2 | 12/2011 | Arik et al. |
| 8,120,908 | B2 | 2/2012 | Arik et al. |
| 8,136,576 | B2 * | 3/2012 | Grimm .............. H05K 7/20172 165/104.34 |
| 8,136,767 | B2 | 3/2012 | Cueman et al. |
| 8,308,078 | B2 | 11/2012 | Arik et al. |
| 8,342,819 | B2 * | 1/2013 | Arik ........................ H01L 23/40 239/102.2 |
| 8,418,934 | B2 | 4/2013 | Arik et al. |
| 8,430,644 | B2 | 4/2013 | Mahalingam et al. |
| 8,434,906 | B2 | 5/2013 | Arik et al. |
| 8,453,715 | B2 | 6/2013 | Arik et al. |
| 8,496,049 | B2 | 7/2013 | Arik et al. |
| 8,529,097 | B2 | 9/2013 | Arik et al. |
| 8,564,217 | B2 | 10/2013 | Han et al. |
| 8,602,607 | B2 | 12/2013 | Arik et al. |
| 8,646,701 | B2 | 2/2014 | Grimm et al. |
| 2008/0006393 | A1 | 1/2008 | Grimm |
| 2009/0084866 | A1 | 4/2009 | Grimm et al. |
| 2010/0044459 | A1 | 2/2010 | Xu et al. |
| 2010/0054973 | A1 | 3/2010 | Arik et al. |
| 2011/0114287 | A1 * | 5/2011 | Arik .................... H05K 7/20172 165/67 |
| 2011/0139429 | A1 | 6/2011 | Salapakkam et al. |
| 2011/0139893 | A1 | 6/2011 | Wetzel et al. |
| 2011/0162823 | A1 | 7/2011 | Sharma et al. |
| 2011/0174462 | A1 | 7/2011 | Arik et al. |
| 2012/0018537 | A1 | 1/2012 | Arik et al. |
| 2012/0097377 | A1 | 4/2012 | Arik et al. |
| 2012/0138704 | A1 | 6/2012 | Saddoughi et al. |
| 2012/0170216 | A1 | 7/2012 | Arik et al. |
| 2013/0213618 | A1 | 8/2013 | Arik et al. |
| 2013/0230934 | A1 | 9/2013 | Arik et al. |
| 2013/0264909 | A1 | 10/2013 | Glaser et al. |
| 2013/0336035 | A1 | 12/2013 | Ramabhadran et al. |
| 2014/0034270 | A1 * | 2/2014 | de Bock ............. H05K 7/20172 165/80.3 |
| 2014/0049970 | A1 | 2/2014 | de Bock et al. |

OTHER PUBLICATIONS

Moheimani, "A Survey of Recent A Survey of Recent Innovations in Vibration Damping and Control Using Shunted Piezoelectric Transducers", IEEE Transactions on Control Systems Technology, vol. 11, No. 4, Jul. 2003, pp. 482-494.

Casella et al., "Modelling and control for vibration suppression in a large flexible structure with jet thrusters and piezoactuators", IEEE Transactions on Control Systems Technology, vol. 10, No. 4, Jul. 2002, pp. 589-599.

* cited by examiner

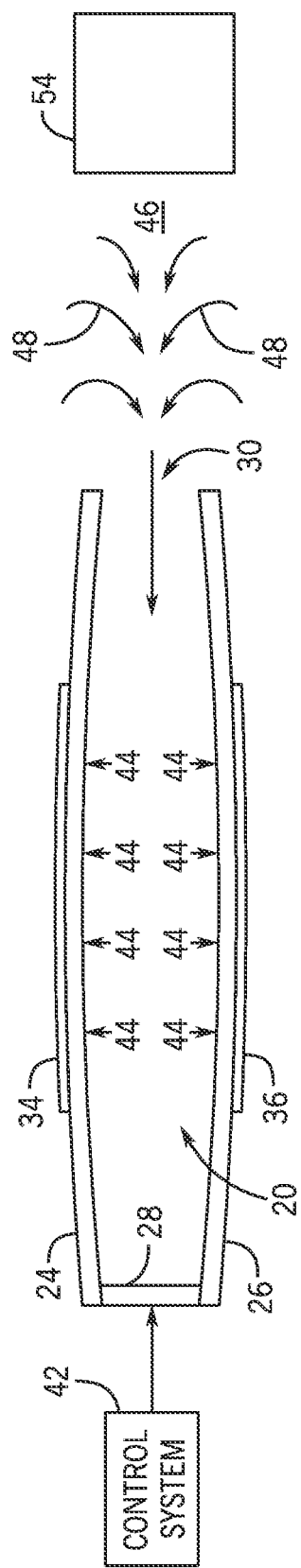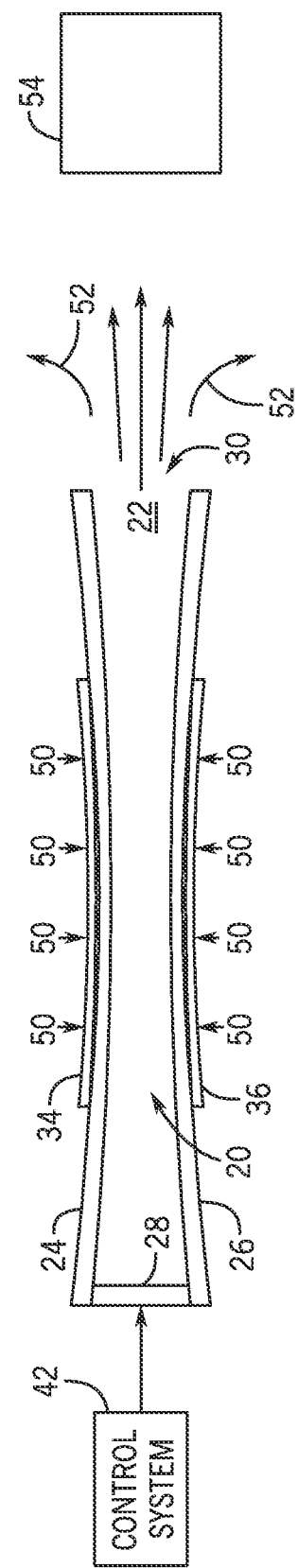

SYNTHETIC JET SUSPENSION STRUCTURE

CROSS-REFERENCE TO RELATED APPLICATION

The present application is a non-provisional of, and claims priority to, U.S. Provisional Patent Application Ser. No. 61/783,954, filed Mar. 14, 2013, the disclosure of which is incorporated herein by reference.

BACKGROUND OF THE INVENTION

Synthetic jet actuators are a widely-used technology that generates a synthetic jet of fluid to influence the flow of that fluid over a surface to disperse heat away therefrom. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, a control system is used to create time-harmonic motion of the volume changing mechanism. As the mechanism decreases the chamber volume, fluid is ejected from the chamber through the orifice. As the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a "synthetic jet."

It is recognized that vibration propagation and acoustic noise are negative aspects of synthetic jet operation. With respect specifically to vibration propagation, it is highly desirable to prevent vibrations from be transmitted from the moving surfaces of the synthetic jet to a mounting structure to which it is attached and/or passed on to the surrounding structures or surfaces the mounting structure is attached to. While providing a mounting structure that minimizes vibration propagation is achievable, such mounting structures also should be designed so as not to dampen the airflow output of the synthetic jet actuator, as can occur if the synthetic jet actuator is restrained rigidly to a fixed stationary surface.

It would therefore be desirable to provide a mounting structure that provides vibration dampening by limiting the amount of undesirable vibrations transmitted from the moving surfaces of the synthetic jet to the mounting structure and to the surfaces the mounting structure is attached to. It would also be desirable for the mounting structure to allow the synthetic jet to function with less dampening on the airflow output than if it was restrained more rigidly to a fixed stationary surface.

BRIEF DESCRIPTION OF THE INVENTION

According to one aspect of the invention, a synthetic jet assembly includes a synthetic jet having a first plate, a second plate spaced apart from the first plate, a spacer element positioned between the first and second plates to maintain the first and second plates in a spaced apart relationship, the spacer element including an orifice formed therein, and an actuator element coupled to at least one of the first and second plates to selectively cause deflection thereof such that a fluid flow is generated and projected out from the orifice. The synthetic jet assembly also includes a mounting bracket positioned about the synthetic jet to support the synthetic jet and a plurality of suspension tabs coupling the synthetic jet to the mounting bracket in a suspended arrangement.

In accordance with another aspect of the invention, a method of manufacturing a synthetic jet assembly includes providing a synthetic jet configured to generate and project a series of fluid vortices, the synthetic jet comprising a first plate, a second plate spaced apart from the first plate, a spacer element including an orifice formed therein and positioned between the first and second plates to maintain the first and second plates in a spaced apart relationship, and an actuator element coupled to at least one of the first and second plates to selectively cause deflection thereof such that the series of fluid vortices is generated and projected out from the orifice. The method also includes positioning a mounting bracket partially about the synthetic jet and forming a plurality of suspension tabs between the synthetic jet body and the mounting bracket, the plurality of suspension tabs mounting the synthetic jet body to the mounting bracket in a suspended arrangement.

In accordance with yet another aspect of the invention, a synthetic jet assembly includes a synthetic jet having a body with a cavity and an orifice formed therein, and at least one actuator element coupled to the body to selectively cause deflection of the body and thereby generate and project a fluid flow out from the orifice. The synthetic jet assembly also includes a U-shaped mounting bracket comprising a plurality of legs and being positioned partially about the synthetic jet to support the synthetic jet and a plurality of suspension tabs coupling the synthetic jet to the mounting bracket and being arranged such that at least one suspension tab is located on each leg of the U-shaped bracket.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 3 is a cross-section of the synthetic jet of FIG. 2 depicting the jet as the control system causes the diaphragms to travel inward, toward the orifice.

FIG. 4 is a cross-section of the synthetic jet actuator of FIG. 2 depicting the jet as the control system causes the diaphragms to travel outward, away from the orifice.

DESCRIPTION OF THE INVENTION

Embodiments of the invention are directed to suspension tabs that provide a semi-flexible connection between the operational (moving) portion of the synthetic jet actuator and a stationary mounting bracket. The tabs provide vibration dampening by limiting the amount of undesirable vibrations transmitted from the moving surfaces of the synthetic jet to the stationary bracket and on to the surfaces the mounting bracket is attached to, while having a minimal affect on an airflow output from the synthetic jet.

Figure 1:
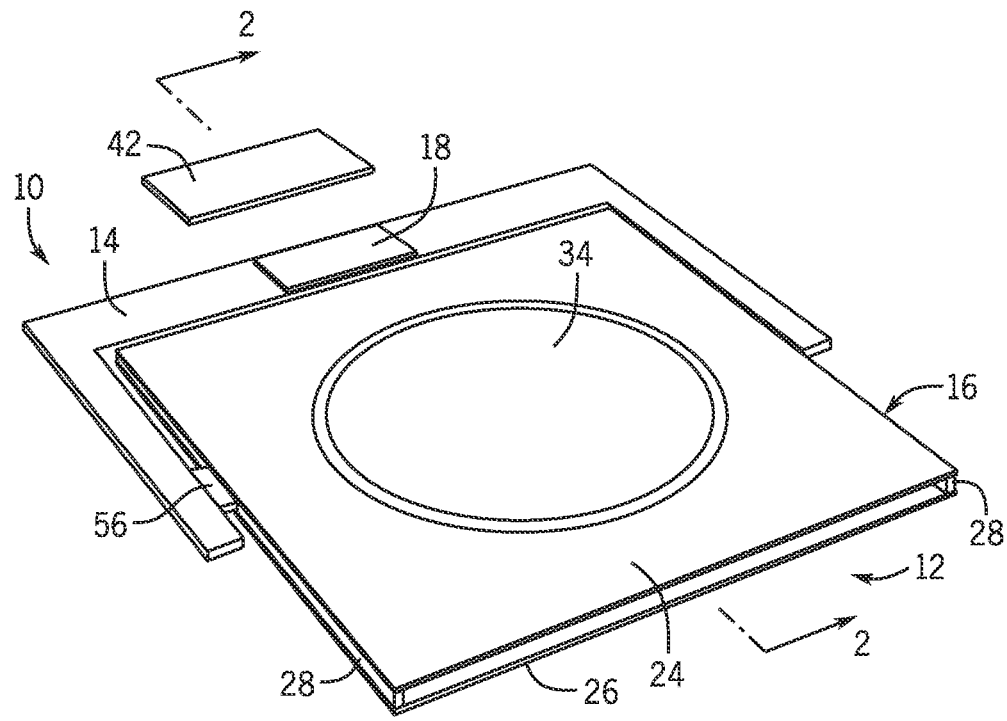
FIG. 1 is a perspective view of a synthetic jet assembly, according to an embodiment of the invention.
Figure 2:
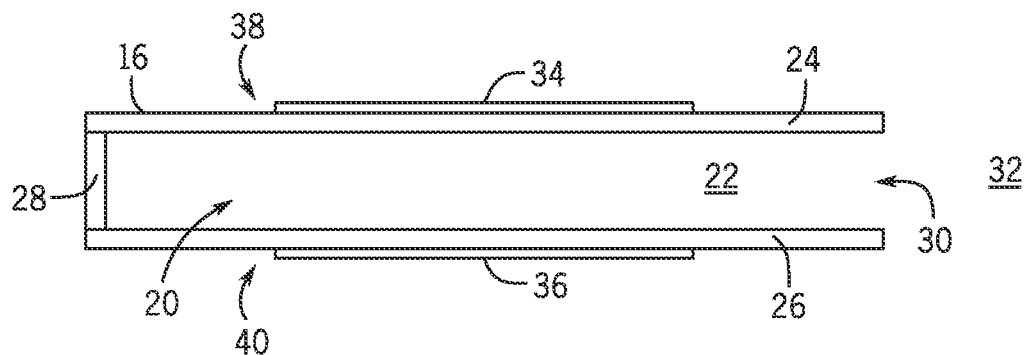
FIG. 2 is a cross-section of a portion of a synthetic jet, according to an embodiment of the invention.

Referring to FIG. 1, a perspective view of a synthetic jet assembly 10 is provided. Synthetic jet assembly 10 includes a synthetic jet 12, a cross-section of which is illustrated in FIG. 2, and a mounting bracket 14. In one embodiment, mounting bracket 14 is a u-shaped mounting bracket that is affixed to a body or housing 16 of synthetic jet 12 at one or more locations. A circuit driver 18 can be externally located or affixed to mounting bracket 14. Alternatively, circuit driver 18 may be remotely located from synthetic jet assembly 10.

Referring now to FIGS. 1 and 2 together, housing 16 of synthetic jet 12 defines and partially encloses an internal chamber or cavity 20 having a gas or fluid 22 therein. While housing 16 and internal chamber 20 can take virtually any geometric configuration according to various embodiments of the invention, for purposes of discussion and understanding, housing 16 is shown in cross-section in FIG. 2 as including a first plate 24 and a second plate 26, which are maintained in a spaced apart relationship by a spacer element 28 positioned therebetween. In one embodiment, spacer element 28 maintains a separation of approximately 1 mm between first and second plates 24, 26. One or more orifices or openings 30 are formed between first and second plates 24, 26 and the side walls of spacer element 28 in order to place the internal chamber 20 in fluid communication with a surrounding, exterior environment 32. In an alternative embodiment, spacer element 28 includes a front surface (not shown) in which one or more orifices 30 are formed.

According to various embodiments, first and second plates 24, 26 may be formed from a metal, plastic, glass, and/or ceramic. Likewise, spacer element 28 may be formed from a metal, plastic, glass, and/or ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include, for example, titanates (such as lanthanum titanate, bismuth titanate, and lead zirconate titanate) and molybdates. Furthermore, various other components of synthetic jet 12 may be formed from metal as well.

Actuators 34, 36 are coupled to respective first and second plates, 24, 26 to form first and second composite structures or flexible diaphragms 38, 40, which are controlled by driver 18 via a controller assembly or control unit system 42. For example, each flexible diaphragm 38, 40 may be equipped with a metal layer and a metal electrode may be disposed adjacent to the metal layer so that diaphragms 38, 40 may be moved via an electrical bias imposed between the electrode and the metal layer. As shown in FIG. 1, in one embodiment controller assembly 42 is electronically coupled to driver 18, which is coupled directly to mounting bracket 14 of synthetic jet 12. In an alternative embodiment control unit system 42 is integrated into a driver 18 that is remotely located from synthetic jet 12. Moreover, control system 42 may be configured to generate the electrical bias by any suitable device, such as, for example, a computer, logic processor, or signal generator.

In one embodiment, actuators 34, 36 are piezoelectric motive (piezomotive) devices that may be actuated by application of a harmonic alternating voltage that causes the piezomotive devices to rapidly expand and contract. During operation, control system 42 transmits an electric charge, via driver 18, to piezoelectric actuators 34, 36, which undergo mechanical stress and/or strain responsive to the charge. The stress/strain of piezomotive actuators 34, 36 causes deflection of respective first and second plates 24, 26 such that a time-harmonic or periodic motion is achieved that changes the volume of the internal chamber 20 between plates 24, 26. According to one embodiment, spacer element 28 can also be made flexible and deform to change the volume of internal chamber 20. The resulting volume change in internal chamber 20 causes an interchange of gas or other fluid between internal chamber 20 and exterior volume 32, as described in detail with respect to FIGS. 3 and 4.

Piezomotive actuators 34, 36 may be monomorph or bimorph devices, according to various embodiments of the invention. In a monomorph embodiment, piezomotive actuators 34, 36 may be coupled to plates 24, 26 formed from materials including metal, plastic, glass, or ceramic. In a bimorph embodiment, one or both piezomotive actuators 34, 36 may be bimorph actuators coupled to plates 24, 26 formed from piezoelectric materials. In an alternate embodiment, the bimorph may include single actuators 34, 36, and plates 24, 26 are the second actuators.

The components of synthetic jet 12 may be adhered together or otherwise attached to one another using adhesives, solders, and the like. In one embodiment, a thermoset adhesive or an electrically conductive adhesive is employed to bond actuators 34, 36 to first and second plates, 24, 26 to form first and second composite structures 38, 40. In the case of an electrically conductive adhesive, an adhesive may be filled with an electrically conductive filler such as silver, gold, and the like, in order to attach lead wires (not shown) to synthetic jet 12. Suitable adhesives may have a hardness in the range of Shore A hardness of 100 or less and may include as examples silicones, polyurethanes, thermoplastic rubbers, and the like, such that an operating temperature of 120 degrees or greater may be achieved.

In an embodiment of the invention, actuators 34, 36 may include devices other than piezoelectric motive devices, such as hydraulic, pneumatic, magnetic, electrostatic, and ultrasonic materials. Thus, in such embodiments, control system 42 is configured to activate respective actuators 34, 36 in corresponding fashion. For example, if electrostatic materials are used, control system 42 may be configured to provide a rapidly alternating electrostatic voltage to actuators 34, 36 in order to activate and flex respective first and second plates 24, 26.

The operation of synthetic jet 12 is described with reference to FIGS. 3 and 4. Referring first to FIG. 3, synthetic jet 12 is illustrated as actuators 34, 36 are controlled to cause first and second plates 24, 26 to move outward with respect to internal chamber 20, as depicted by arrows 44. As first and second plates 24, 26 flex outward, the internal volume of internal chamber 20 increases, and ambient fluid or gas 46 rushes into internal chamber 20 as depicted by the set of arrows 48. Actuators 34, 36 are controlled by control system 42 so that when first and second plates 24, 26 move outward from internal chamber 20, vortices are already removed from edges of orifice 30 and thus are not affected by the ambient fluid 46 being drawn into internal chamber 20. Meanwhile, a jet of ambient fluid 46 is synthesized by vortices creating strong entrainment of ambient fluid 46 drawn from large distances away from orifice 30.

FIG. 4 depicts synthetic jet 12 as actuators 34, 36 are controlled to cause first and second plates 24, 26 to flex inward into internal chamber 20, as depicted by arrows 50. The internal volume of internal chamber 20 decreases, and fluid 22 is ejected as a cooling jet through orifice 30 in the direction indicated by the set of arrows 52 toward a device 54 to be cooled, such as, for example a light emitting diode. As the fluid 22 exits internal chamber 20 through orifice 30, the fluid flow separates at the sharp edges of orifice 30 and creates vortex sheets which roll into vortices and begin to move away from edges of orifice 30.

While the synthetic jet of FIGS. 1-4 is shown and described as having a single orifice therein, it is also envisioned that embodiments of the invention may include multiple orifice synthetic jet actuators. Additionally, while the synthetic jet actuators of FIGS. 1-4 are shown and described as having an actuator element included on each of first and second plates, it is also envisioned that embodiments of the invention may include only a single actuator element positioned on one of the plates. Furthermore, it is also envisioned that the synthetic jet plates may be provided in a circular, rectangular, or alternatively shaped configuration, rather than in a square configuration as illustrated herein.

Referring back again to FIG. 1, and as shown therein, the mounting bracket 14 of synthetic jet assembly 10—which may be formed as a rigid, metallic u-shaped mounting bracket according to one exemplary embodiment of the invention—is affixed to housing 16 of the synthetic jet 12 at one or more locations by way of suspension tabs 56. The suspension tabs 56 affixing the mounting bracket 14 to the synthetic jet 12 are better illustrated in FIGS. 5A-5C, FIGS. 6A-6C, FIG. 7, FIG. 8 and FIG. 9, according to various embodiments of the invention. In each of the embodiments, the suspension tabs 56 function to suspend the synthetic jet 12 with respect to the mounting bracket 14 so as to isolate the moving parts of the synthetic jet assembly 10 (i.e., the body 16) from the stationary part of the synthetic jet assembly 10 (i.e., the mounting bracket 14). The suspension tabs 56 assist in locating the synthetic jet 12 in a specific desired location with less constraints than if the synthetic jet's moving surfaces were attached to a fixed mounting surface more rigidly and also allow the synthetic jet 12 to function with less dampening on the airflow output than if it was restrained more rigidly to a fixed stationary surface. The suspension tabs 56 may be formed in a number of different manners, including being applied or dispensed at desired locations so as to form a connection between the mounting bracket 14 and the synthetic jet 12.

According to an exemplary embodiment of the invention, the suspension tabs 56 are constructed of a semi-flexible material that provides a connection between the body 16 of the synthetic jet 12 and the rigid stationary mounting bracket 14. According to an exemplary embodiment, the suspension tabs 56 form a connection between the spacer element 28 (FIGS. 1-4) of the synthetic jet 12 and the mounting bracket 14; however, it is envisioned that the suspension tabs 56 could instead form a connection between the plates 24, 26 of the synthetic jet 12 and the mounting bracket 14. The suspension tabs 56 may be formed of any of a number of suitable elastomeric materials, including saturated and unsaturated rubbers. As one example, the suspension tabs 56 are formed of a silicone elastomer that provides the flexible or semi-flexible connection between the synthetic jet 12 and the mounting bracket 14. The semi-flexible suspension tabs 56 are constructed to have a mechanical strength sufficient to hold the synthetic jet 12 in a mostly stationary position relative to mounting bracket 14 but offer a limited flexibility that provides vibration dampening by limiting the amount of undesirable vibrations that are transmitted from the moving surfaces of the synthetic jet 12 to the stationary bracket 14 (and further onto the surface or substrate the mounting bracket is attached to). The specific material composition of the suspension tabs 56 can be chosen to selectively control the amount of vibration dampening.

The amount of vibration dampening provided by suspension tabs 56 is a function not only of the material composition of the tabs, but also the size, location and quantity of the suspension tabs 56. Accordingly the size, location and quantity of the suspension tabs 56 employed to affix the synthetic jet 12 to the mounting bracket 14 may be selected during fabrication/manufacturing of the synthetic jet assembly 10 to selectively control vibration dampening. Various embodiments and arrangements of the tabs are illustrated in FIGS. 5A-5C, FIGS. 6A-6C, FIG. 7, FIG. 8 and FIG. 9. While the size, location and quantity of the suspension tabs 56 varies between the specific embodiments, it is recognized that—in each embodiment—at least one suspension tab 56 is located on each leg or segment 58, 60, 62 of the u-shaped mounting bracket, so as to adequately couple the synthetic jet 12 to the mounting bracket 14.

Figure 5A:
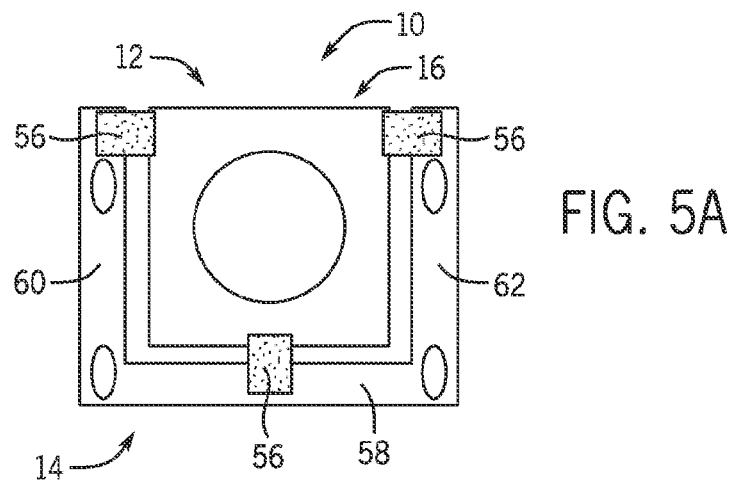
FIGS. 5A-5C are top views of various synthetic jet assemblies that incorporate an arrangement of three suspension tabs therein, according to embodiments of the invention.
Figure 5B:
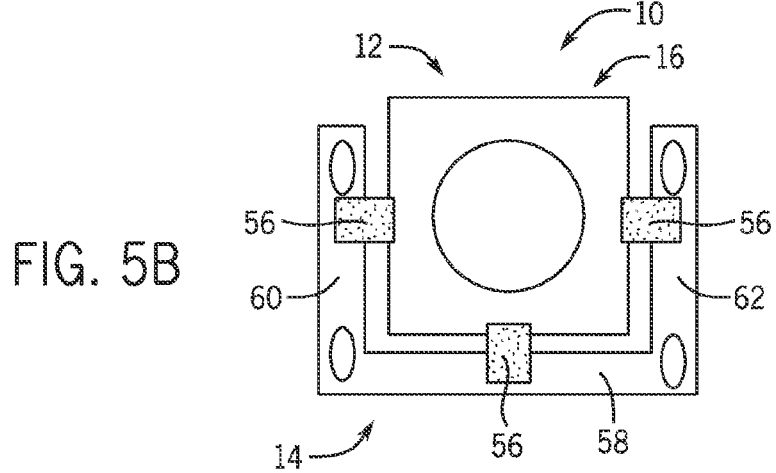
Figure 5C:
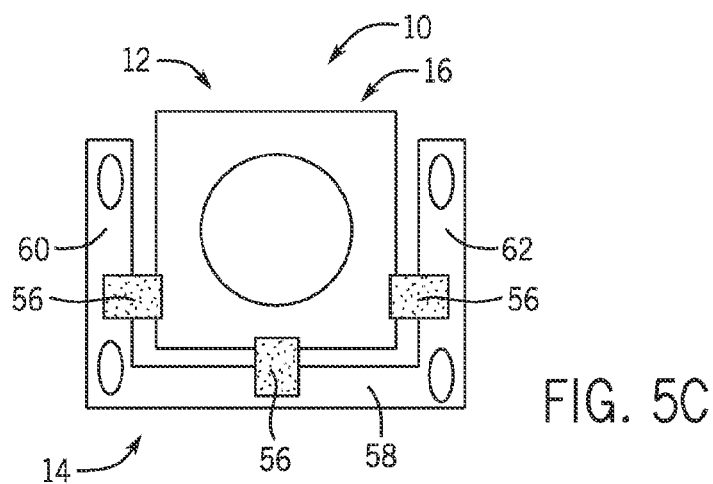

Referring first to FIGS. 5A-5C, synthetic jet assemblies 10 are shown that each employ three suspension tabs 56 for affixing the synthetic jet 12 to the mounting bracket 14. A single suspension tab 56 is positioned on each respective leg/segment 58, 60, 62 of the u-shaped mounting bracket, with the suspension tabs 56 providing three mounting points between the mounting bracket 14 and the body 16 of the synthetic jet. In each embodiment, the suspension tab 56 included on the rear or connecting leg 58 of the u-shaped bracket 14 is positioned at the center of the rear leg 58—while the suspension tabs 56 included on the side legs 60, 62 of the u-shaped bracket 14 may be positioned at a forward location (FIG. 5A), center location (FIG. 5B) or rear location (FIG. 5C) of the respective side legs 60, 62.

Figure 6A:
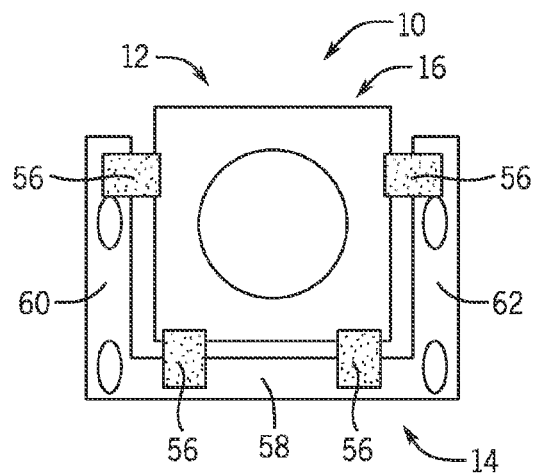
FIGS. 6A-6C are top views of various synthetic jet assemblies that incorporate an arrangement of four suspension tabs therein, according to embodiments of the invention.
Figure 6B:
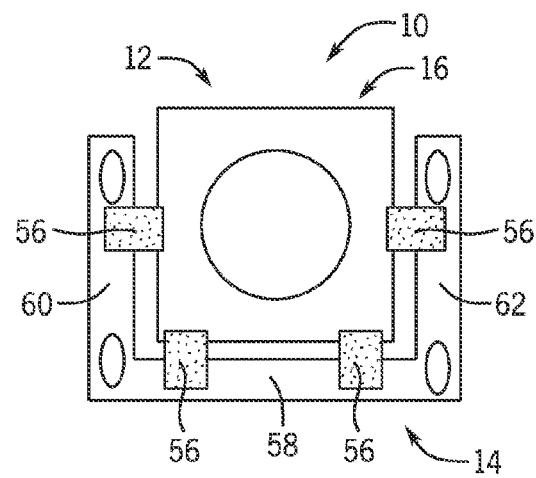
Figure 6C:
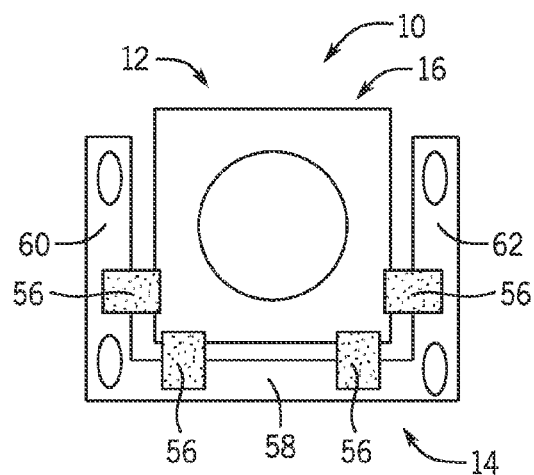

Referring next to FIGS. 6A-6C, synthetic jet assemblies 10 are shown that each employ four suspension tabs 56 for affixing the synthetic jet 12 to the mounting bracket 14 with the suspension tabs 56 providing three mounting points between the mounting bracket 14 and the body 16 of the synthetic jet. A pair of suspension tabs 56 is positioned on the rear leg 58 of the u-shaped mounting bracket 14, with the suspension tabs 56 being located at generally opposite ends of the rear leg 58. A single suspension tab 56 is positioned on each respective side leg 60, 62 of the u-shaped mounting bracket 14, with the suspension tabs 56 on the side legs 60, 62 being positioned at either a forward location (FIG. 6A), center location (FIG. 6B) or rear location (FIG. 6C) of the respective side legs 60, 62.

Figure 7:
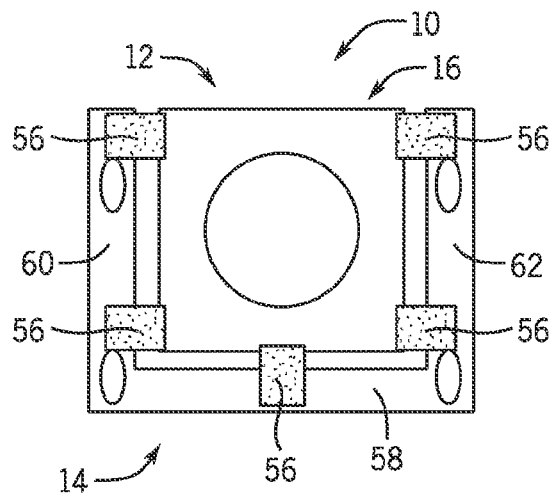
FIG. 7 is a top view of a synthetic jet assembly that incorporates an arrangement of five suspension tabs therein, according to an embodiment of the invention.
Figure 8:
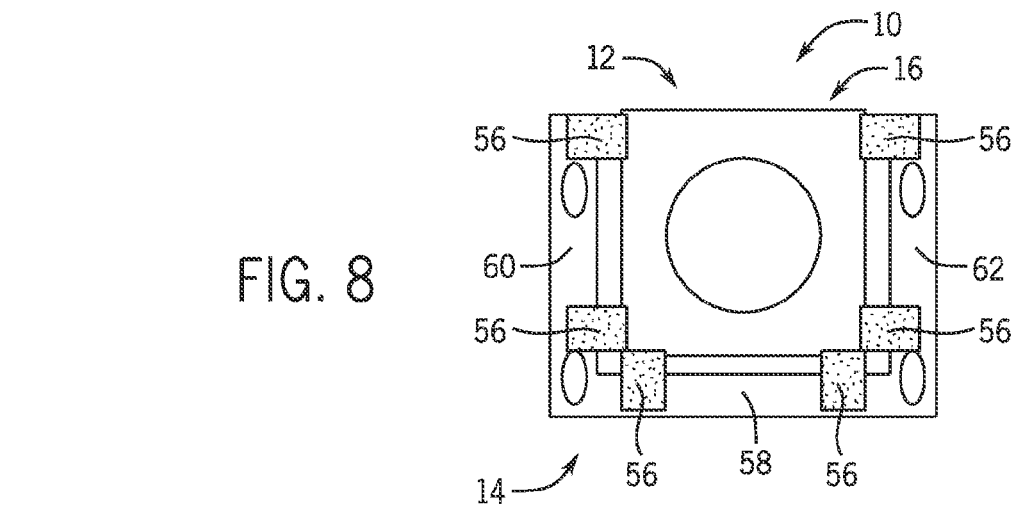
FIG. 8 is a top view of a synthetic jet assembly that incorporates an arrangement of six suspension tabs therein, according to an embodiment of the invention.
Figure 9:
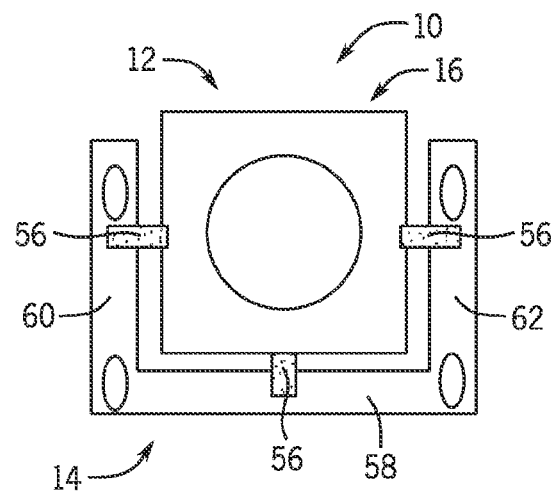
FIG. 9 is a top view of a synthetic jet assembly that incorporates an arrangement of three thin suspension tabs therein, according to an embodiment of the invention.

Additional embodiments of synthetic jet assemblies 10 employing still other suspension tab arrangements are shown in FIGS. 7-9. In FIG. 7, a synthetic jet assembly 10 is shown that employs five suspension tabs 56 for affixing the synthetic jet 12 to the mounting bracket, while in FIG. 8 a synthetic jet assembly 10 is shown that employs six suspension tabs 56 for affixing the synthetic jet 12 to the mounting bracket 14. In FIG. 9, a synthetic jet assembly 10 is shown that employs three suspension tabs 56 for affixing the synthetic jet 12 to the mounting bracket 14—similar to the synthetic jet assembly 10 shown in FIG. 5B. However, the synthetic jet assembly 10 of FIG. 9 includes suspension tabs 56 having a thinner construction than the synthetic jet assembly 10 of FIG. 5B. The thinner suspension tabs 56 serve to alter the amount of vibration dampening provided by the suspension tabs 56 as compared to the thicker suspension tabs 56 employed in the synthetic jet assembly 10 of FIG. 5B.

While the material composition, size, location and quantity of the suspension tabs 56 in the synthetic jet assemblies 10 of FIGS. 5A-5C, FIGS. 6A-6C, FIG. 7, FIG. 8 and FIG. 9 are described above as selectively controlling vibration dampening in the assemblies, it is recognized that the size, location and quantity of the suspension tabs 56 also has an effect on the modal shape of the moving surfaces of the synthetic jet (i.e., plates 24, 26). That is, the size, location and quantity of the suspension tabs 56 determines the extent to which the moving surfaces of the synthetic jet 12 are anchored in specific locations to the fixed mounting bracket 14. This effect on modal shape that results from the suspension tabs 56 is directly related to the airflow output of the synthetic jet 12, as well as acoustic noise and vibrations generated by imbalanced moving surfaces. That is, the suspension tabs 56 allow for a maximum amplitude over the full width of the synthetic jet 12 that is utilized for flow production and also enable operation at a mechanical resonance mode that has a low resonance frequency so as to reduce the apparent acoustic noise generated by the synthetic jet 12. Thus, the material composition, size, location and quantity of the suspension tabs 56 in the synthetic jet assembly 10 can be selected based on the desired performance characteristics of the synthetic jet 12.

It is recognized that synthetic jet assemblies 10 that employ suspension tabs 56 for affixing the synthetic jet 12 to a mounting bracket 14 are not limited to structures that include square/rectangular synthetic jets 12 and a u-shaped mounting bracket 14, such as are shown in FIGS. 5A-5C, FIGS. 6A-6C, FIG. 7, FIG. 8 and FIG. 9. That is, synthetic jet assemblies 10 having other shapes and configurations are also envisioned as falling within the scope of the invention. For example, a synthetic jet assembly 10 that includes a circular synthetic jet and a semi-circular mounting bracket that employs three suspension tabs for affixing the synthetic jet to the mounting bracket is considered to be within the scope of the invention.

While embodiments of the invention described above are directed to synthetic jet assemblies 10 that incorporate a mounting bracket 14 and arrangement of suspension tabs 56 for purposes of restraining the synthetic jet in a specified location relative to a stationary surface, it is envisioned that other mounting mechanisms might be employed. For example, as one alternative to the mounting bracket and suspension tabs described above, the synthetic jet 12 could be mounted on "tabs" or soft protrusions extending out from the moving portion of the synthetic jet to support the device without need of an actual mounting bracket. In this case, the protrusions wouldn't be connecting the moving portion of the synthetic jet to a mounting bracket, but would still be providing suspension of the device from a stationary surface.

Beneficially, embodiments of the invention thus provide a synthetic jet assembly including an arrangement of suspension tabs that function to suspend the synthetic jet with respect to the mounting bracket so as to isolate the moving parts of the synthetic jet assembly from the stationary part of the synthetic jet assembly 10. The suspension tabs provide a low cost method of restraining the synthetic jet in a specified location (i.e., locating the synthetic jet in a specific desired location) with less constraints than if the synthetic jet's moving surfaces were attached to a fixed mounting surface more rigidly. The suspension tabs also allow the synthetic jet to function with minimal impact regarding dampening the positive airflow the synthetic jet generates (i.e., the airflow output), as compared to if it was restrained more rigidly to a fixed stationary surface. Still further, the material composition, size, location and quantity of the suspension tabs can be tailored to have a specific desired effect on the modal shape of the synthetic jet's actuation.

Therefore, according to one embodiment of the invention, a synthetic jet assembly includes a synthetic jet having a first plate, a second plate spaced apart from the first plate, a spacer element positioned between the first and second plates to maintain the first and second plates in a spaced apart relationship, the spacer element including an orifice formed therein, and an actuator element coupled to at least one of the first and second plates to selectively cause deflection thereof such that a fluid flow is generated and projected out from the orifice. The synthetic jet assembly also includes a mounting bracket positioned about the synthetic jet to support the synthetic jet and a plurality of suspension tabs coupling the synthetic jet to the mounting bracket in a suspended arrangement.

According to another aspect of the invention, a method of manufacturing a synthetic jet assembly includes providing a synthetic jet configured to generate and project a series of fluid vortices, the synthetic jet comprising a first plate, a second plate spaced apart from the first plate, a spacer element including an orifice formed therein and positioned between the first and second plates to maintain the first and second plates in a spaced apart relationship, and an actuator element coupled to at least one of the first and second plates to selectively cause deflection thereof such that the series of fluid vortices is generated and projected out from the orifice. The method also includes positioning a mounting bracket partially about the synthetic jet and forming a plurality of suspension tabs between the synthetic jet body and the mounting bracket, the plurality of suspension tabs mounting the synthetic jet body to the mounting bracket in a suspended arrangement.

According to yet another aspect of the invention, a synthetic jet assembly includes a synthetic jet having a body with a cavity and an orifice formed therein, and at least one actuator element coupled to the body to selectively cause deflection of the body and thereby generate and project a fluid flow out from the orifice. The synthetic jet assembly also includes a U-shaped mounting bracket comprising a plurality of legs and being positioned partially about the synthetic jet to support the synthetic jet and a plurality of suspension tabs coupling the synthetic jet to the mounting bracket and being arranged such that at least one suspension tab is located on each leg of the U-shaped bracket.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A synthetic jet assembly comprising:
a synthetic jet including:
a first plate;
a second plate spaced apart from the first plate;
a spacer element positioned between the first and second plates to maintain the first and second plates in a spaced apart relationship, the spacer element including an orifice formed therein; and
an actuator element coupled to at least one of the first and second plates to selectively cause deflection thereof such that a fluid flow is generated and projected out from the orifice;
a rigid, stationary U-shaped mounting bracket positioned about the synthetic jet to support the synthetic jet; and
a plurality of suspension tabs coupling the synthetic jet to the U-shaped mounting bracket in a suspended arrangement;
wherein the plurality of suspension tabs comprises an arrangement of three suspension tabs, four suspension tabs, five suspension tabs, or six suspension tabs.

2. The synthetic jet assembly of claim 1 wherein the U-shaped mounting bracket is a rigid structure as compared to the plurality of suspension tabs; and
wherein each of the plurality of suspension tabs is formed of an elastomeric material that provides a semi-flexible connection between the synthetic jet and the U-shaped mounting bracket.

3. The synthetic jet assembly of claim 2 wherein the suspension tabs formed from the elastomeric material are constructed to provide vibration dampening between the synthetic jet and the U-shaped mounting bracket.

4. The synthetic jet assembly of claim 1 wherein the U-shaped mounting bracket comprises a rear leg connecting a pair of side legs.

5. The synthetic jet assembly of claim 4 wherein the plurality of tabs are arranged such that at least one suspension tab is located on each of the rear leg and the pair of side legs.

6. The synthetic jet assembly of claim 5 wherein the at least one suspension tab located on each side leg comprises either:
a single suspension tab positioned so as to be centered on, forward of center, or rear of center on the side leg; or
a pair of suspension tabs positioned so as to be located on both sides of center on the side leg.

7. The synthetic jet assembly of claim 1 wherein the plurality of suspension tabs are affixed to the spacer element or the first and second plates of the synthetic jet to couple the synthetic jet to the U-shaped mounting bracket.

8. The synthetic jet assembly of claim 7 wherein the plurality of suspension tabs anchor the first and second plates to the U-shaped mounting bracket so as to affect a modal shape of the first and second plates during operation of the synthetic jet.

9. A method of manufacturing a synthetic jet assembly comprising:
providing a synthetic jet configured to generate and project a series of fluid vortices, the synthetic jet comprising:
a first plate;
a second plate spaced apart from the first plate;
a spacer element positioned between the first and second plates to maintain the first and second plates in a spaced apart relationship, the spacer element including an orifice formed therein; and
an actuator element coupled to at least one of the first and second plates to selectively cause deflection thereof such that the series of fluid vortices is generated and projected out from the orifice;
positioning a mounting bracket partially about the synthetic jet; and
applying a plurality of suspension tabs between the synthetic jet body and the mounting bracket, the plurality of suspension tabs mounting the synthetic jet body to the mounting bracket in a suspended arrangement;
wherein positioning the mounting bracket comprises positioning a U-shaped mounting bracket partially about the synthetic jet; and
wherein forming the plurality of suspension tabs comprises forming at least one suspension tab on each leg of the U-shaped bracket, such that three edges of the synthetic jet are affixed to the U-shaped mounting bracket.

10. The method of claim 9 wherein forming the plurality of suspension tabs comprises applying an elastomeric material between the synthetic jet and the mounting bracket at a number of locations.

11. The method of claim 10 wherein the suspension tabs formed from the elastomeric material are constructed to provide vibration dampening between the synthetic jet and the mounting bracket.

12. The method of claim 9 wherein the plurality of suspension tabs anchor the first and second plates to the mounting bracket so as to control a modal shape of the first and second points during operation of the synthetic jet.

13. A synthetic jet assembly comprising:
a synthetic jet comprising:
a body having a cavity and an orifice formed therein; and
at least one actuator element coupled to the body to selectively cause deflection of the body and thereby generate and project a fluid flow out from the orifice;
a rigid, metallic U-shaped mounting bracket comprising a rear leg connecting a pair of side legs, the rigid, metallic U-shaped mounting bracket being positioned partially about the synthetic jet to support the synthetic jet; and
a plurality of suspension tabs coupling the synthetic jet to the U-shaped mounting bracket, the plurality of suspension tabs being arranged such that at least one suspension tab is located on each leg of the rear leg and the pair of side legs.

14. The synthetic jet assembly of claim 13 wherein the body of the synthetic jet includes:
a first plate;
a second plate spaced apart from the first plate; and
a spacer element positioned between the first and second plates to maintain the first and second plates in a spaced apart relationship, the spacer element including an orifice formed therein;
wherein the at least one actuator element is coupled to at least one of the first and second plates to selectively cause deflection thereof such that the fluid flow is generated and projected out from the orifice.

15. The synthetic jet assembly of claim 13 wherein each of the plurality of suspension tabs provides a semi-flexible connection between the synthetic jet and the U-shaped mounting bracket, so as to provide vibration dampening between the synthetic jet and the U-shaped mounting bracket.

16. The synthetic jet assembly of claim 13 wherein the plurality of suspension tabs are affixed to the body of the synthetic jet to couple the synthetic jet to the U-shaped mounting bracket.

17. The synthetic jet assembly of claim 16 wherein the plurality of suspension tabs anchor the body to the U-shaped mounting bracket so as to control a modal shape of the body during operation of the synthetic jet.

* * * * *